United States Patent
Jeon et al.

(10) Patent No.: US 10,897,018 B2
(45) Date of Patent: Jan. 19, 2021

(54) DISPLAY DEVICE

(71) Applicant: SAMSUNG DISPLAY CO., LTD., Yongin-si (KR)

(72) Inventors: Myoung-Ha Jeon, Asan-si (KR); Ki Chang Lee, Gwacheon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 21 days.

(21) Appl. No.: 16/164,442

(22) Filed: Oct. 18, 2018

(65) Prior Publication Data
US 2019/0259965 A1    Aug. 22, 2019

(30) Foreign Application Priority Data
Feb. 20, 2018   (KR) .......................... 10-2018-0019871

(51) Int. Cl.
*H01L 51/00* (2006.01)
*H01L 27/32* (2006.01)
*H01L 51/52* (2006.01)

(52) U.S. Cl.
CPC ........ *H01L 51/0097* (2013.01); *H01L 27/323* (2013.01); *H01L 51/5253* (2013.01); *H01L 51/5281* (2013.01); *H01L 27/3244* (2013.01); *H01L 2251/5338* (2013.01)

(58) Field of Classification Search
CPC ............. H01L 51/0097; H01L 51/5253; H01L 51/5281; H01L 51/5293; H01L 2251/5338
See application file for complete search history.

(56) References Cited

U.S. PATENT DOCUMENTS

| | | | |
|---|---|---|---|
| 2010/0208188 A1* | 8/2010 | Tsai | H01L 51/5246 349/153 |
| 2016/0204368 A1 | 7/2016 | Zhang et al. | |
| 2016/0329520 A1* | 11/2016 | Namkung | H01L 51/5253 |
| 2017/0047547 A1* | 2/2017 | Son | H01L 51/5253 |
| 2017/0237025 A1 | 8/2017 | Choi et al. | |
| 2017/0294621 A1* | 10/2017 | Higano | H01L 51/5253 |
| 2018/0076400 A1* | 3/2018 | Jung | B32B 27/30 |
| 2018/0217640 A1* | 8/2018 | Nishikawa | G06F 1/1637 |

FOREIGN PATENT DOCUMENTS

| | | |
|---|---|---|
| KR | 10-2017-0020674 | 2/2017 |
| KR | 1020170020626 | 2/2017 |
| KR | 10-2017-0091587 | 8/2017 |
| KR | 10-2017-0093835 | 8/2017 |
| KR | 10-2017-0095280 | 8/2017 |
| WO | WO 2016/085103 | 6/2016 |
| WO | WO 2016/093476 | 6/2016 |

* cited by examiner

*Primary Examiner* — David C Spalla
(74) *Attorney, Agent, or Firm* — F. Chau & Associates, LLC

(57) ABSTRACT

A display device includes a substrate that includes a bending area, a display active layer disposed on the substrate and that displays an image, a polarization layer disposed on the display active layer, a protective layer that contacts an end of the polarization layer and covers the bending area of the substrate; and an adhesive layer disposed on a boundary between the polarization layer and the protective layer, the adhesive layer extends from the end of the polarization layer toward the bending area by an extension area to overlap a portion of the protective layer.

19 Claims, 12 Drawing Sheets

DISPLAY DEVICE

CROSS-REFERENCE TO RELATED APPLICATION

This application claims priority under 35 U.S.C., § 119 from, and the benefit of, Korean Patent Application No. 10-2018-0019871, filed in the Korean Intellectual Property Office on Feb. 20, 2018, the contents of which are herein incorporated by reference in theft entirety.

BACKGROUND

(a) Technical Field

Embodiments of the present disclosure are directed to a display device, and more particularly, to a display device that can reduce dead space thereof.

(b) Discussion of the Related Art

Recently, a flexible display device that uses a substrate comprising a flexible material such as plastic has been developed. Flexible display devices are next-generation display devices that can be used not only in TVs and computer monitors but also in portable devices and wearable devices.

On the other hand, a display device that can reduce dead space thereof by using flexible substrate has been developed. The dead space of a display device refers to a non-display area in which an image is not displayed, and the non-display area is disposed around a display area.

It is possible to reduce the dead space of the display device by incorporating a flexible substrate into the display device and bending an area. However, as the flexible substrate is bent, the substrate may crack, or a wire disposed on the substrate may crack. To prevent such a crack, a protective layer may be applied to the bent area, but delamination defects of the protective layer may occur when the substrate is bent.

SUMMARY

Embodiments of the present disclosure can provide a display device that can prevent delamination defects of a protective layer, that can prevent damage to the display device from being bent, and that can effectively reduce dead space of the display device.

An exemplary embodiment of the present disclosure provides a display device, including: a substrate that includes a bending area; a display active layer disposed on the substrate and that displays an image; a polarization layer disposed on the display active layer; a protective layer that contacts an end of the polarization layer and covers the bending area of the substrate; and an adhesive layer disposed on a boundary between the polarization layer and the protective layer, the adhesive layer extends from the end of the polarization layer toward the bending area by an extension area to overlap a portion of the protective layer.

The extension area ranges from 50 μm to 300 μm in width.

The substrate may include a display area on which the display active layer is disposed and a non-display area that includes the bending area.

The adhesive layer may overlap the polarization layer in the display area, and may overlap the portion of the protective layer in the non-display area, and the protective layer may contact an end of the display active layer.

An upper surface of the protective layer may be coplanar with an upper surface of the polarization layer.

An upper surface of the protective layer may be higher than an upper surface of the polarization layer.

The display device may further include a laminated member disposed on the adhesive layer, wherein the laminated member may be disposed on a boundary between the polarization layer and the protective layer.

The laminated member may be a touch panel.

Another embodiment of the present disclosure provides a display device, including: a substrate that includes a bending area; a display active layer disposed on the substrate and that displays an image; a polarization layer disposed on the display active layer; a protective layer that contacts an end of the polarization layer and covers the bending area of the substrate; an adhesive layer disposed on the polarization layer; and a filling layer disposed on the boundary between the polarization layer and the protective layer that contacts an end of the adhesive layer, and includes an extension area that extends from the end of the polarization layer toward the bending area and overlaps the portion of the protective layer.

The extension area ranges from 50 μm to 300 μm in width.

The substrate may include a display area on which the display active layer is disposed and a non-display area that includes the bending area.

The filling layer may overlap some of the polarization layer in the display area, and overlaps the portion of the protective layer in the non-display area, and the protective layer may contact an end of the display active layer.

The display device may further include a laminated member disposed on the adhesive layer and the filling layer, wherein the laminated member may be disposed on the boundary between the polarization layer and the protective layer.

Another embodiment of the present disclosure provides a display device, including: a substrate that includes a bending area; a display active layer disposed on the substrate and that displays an image; a protective layer that contacts an end of the display active layer and covers the bending area of the substrate; and a polarization layer disposed on a boundary between the display active layer and the protective layer and that includes an extension area that extends from the end of the display active layer toward the bending area and overlaps a portion of the protective layer.

The extension area ranges from 50 μm to 300 μm in width.

The substrate may include a display area on which the display active layer is disposed and a non-display area that includes the bending area.

The polarization layer may overlap the display active layer in the display area, and overlaps the portion of the protective layer in the non-display area.

The display device may further include a first adhesive layer disposed between the display active layer and the polarization layer, wherein the first adhesive layer may overlap the display active layer in the display area, and may extend from the end of the display active layer toward the bending area and overlaps the portion of the protective layer in the non-display area.

The display device may further include: a second adhesive layer disposed on the polarization layer; and a laminated member disposed on the second adhesive layer, wherein the laminated member may overlap a boundary between the polarization layer and the protective layer.

The second adhesive layer may overlap the polarization layer in the display area, and does not extend into the non-display area.

According to an exemplary embodiment of the present disclosure, delamination defects of a protective layer that protecting a bent area can be prevented, and the display device can be prevented from being damaged by being bent. Therefore, it is possible to further reduce dead space of the display device.

DETAILED DESCRIPTION

Figure 1:
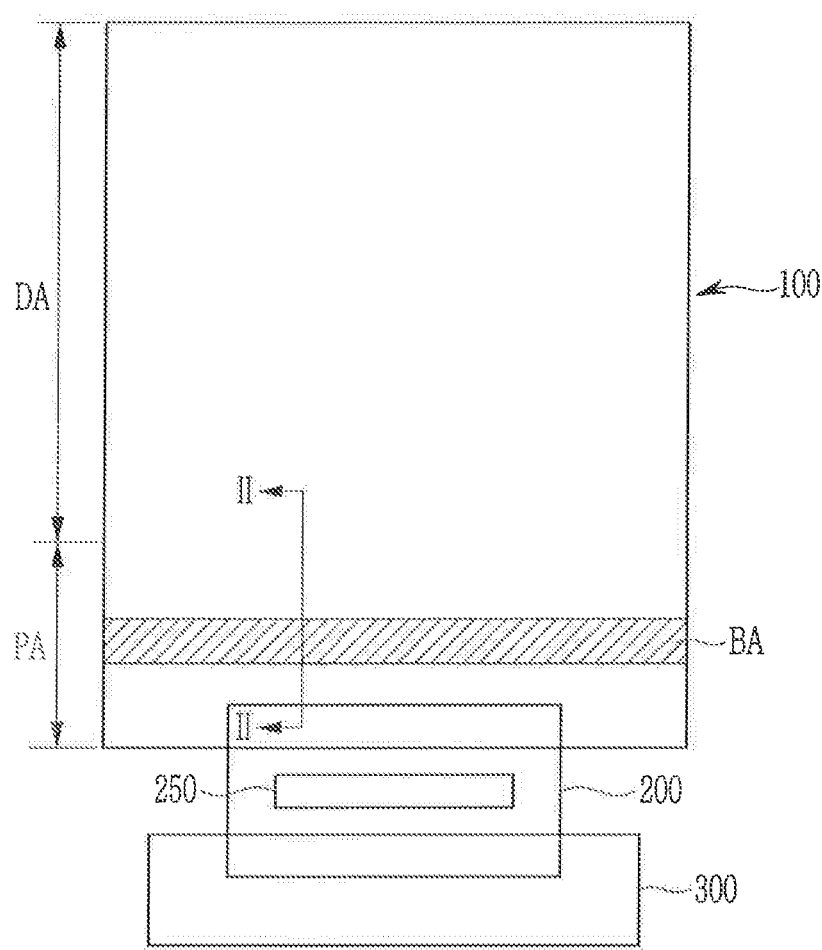
FIG. 1 is a block diagram of a display device according to an exemplary embodiment of the present disclosure in a plan view.

Embodiments of the present disclosure will be described more fully hereinafter with reference to the accompanying drawings, in which exemplary embodiments of the disclosure are shown. As those skilled in the art would realize, the described embodiments may be modified in various different ways, all without departing from the spirit or scope of the present disclosure.

Like reference numerals may designate like elements throughout the specification.

In the drawings, the thicknesses of layers, films, panels, regions, etc. may be exaggerated for clarity.

It will be understood that when an element such as a layer, film, region, or substrate is referred to as being "on" another element, it can be directly on the other element or intervening elements may also be present.

Hereinafter, a display device according to an exemplary embodiment will be described with reference to FIG. 1 to FIG. 3.

FIG. 1 is a block diagram of a display device according to an exemplary embodiment of the present disclosure in a plan view. FIG. 2 is a cross-sectional view taken along line II-II of FIG. 1. FIG. 3 illustrates a state in which the display device of FIG. 1 is bent.

Referring to FIG. 1, according to an embodiment, a display device 1000 includes a display panel 100, a printed circuit board (PCB) 300, and a flexible printed circuit film 200. The flexible printed circuit film 200 connects the display panel 100 and the printed circuit board 300.

The display panel 100 includes a display area DA and a non-display area PA. The display area DA is an area that includes a plurality of pixels and displays an image. The non-display area PA is an area in which elements and wires that generate or transmit various signals to the display area DA are disposed.

According to an embodiment, one side of the flexible printed circuit film 200 is connected to the non-display area PA of the display panel 100, and another side of the flexible printed circuit film 200 is connected to the printed circuit board 300. A driving circuit portion 250 is disposed on the flexible printed circuit film 200. The driving circuit portion 250 generates a data signal transmitted to the plurality of pixels.

According to an embodiment, the printed circuit board 300 generates a driving signal that drives the display panel 100 and a plurality of signals for transmitting the driving signal at an appropriate time, and then transmits them to the display panel 100 through the flexible printed circuit film 200 and the driving circuit portion 250.

According to an embodiment, the non-display area PA of the display panel 100 includes a bending area BA. The bending area BA is an area of the display panel 100 that can be bent. The display panel 100 can be bent by the bending area BA. Accordingly, as shown in FIG. 3, parts of the display panel 100, such as the non-display area PA and the flexible printed circuit film 200 are disposed on a rear surface of the display panel 100. In this case, the printed circuit board 300 is also disposed on the rear surface of the display panel 100. The non-display area PA is bent at the bending area BA to be disposed on the rear surface of the display panel 100, thereby reducing dead space due to the non-display area PA.

Figure 2:
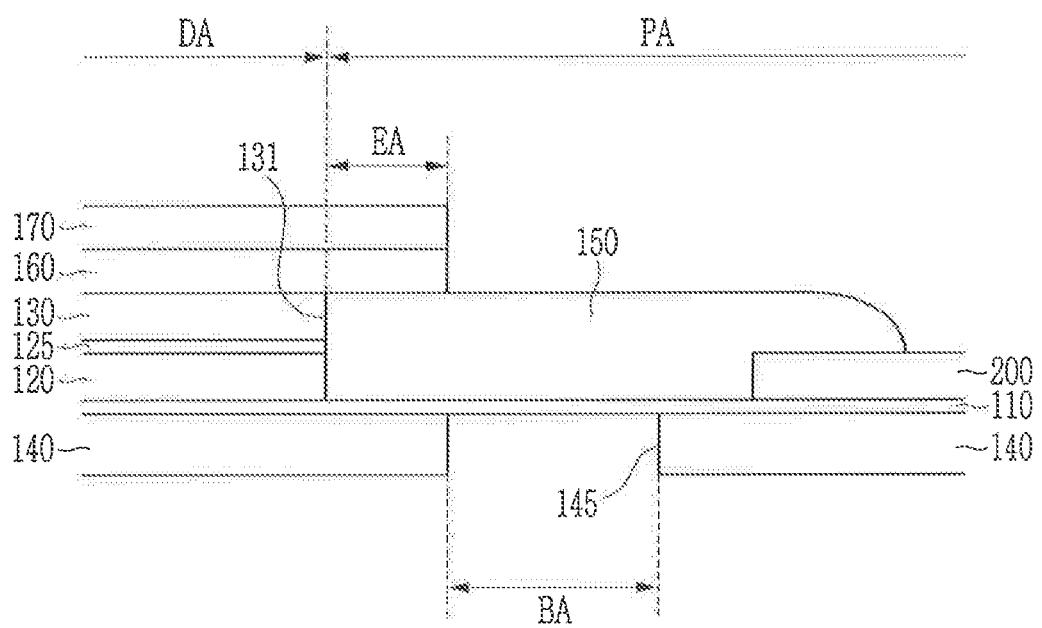
FIG. 2 is a cross-sectional view taken along line II-II of FIG. 1.
Figure 3:
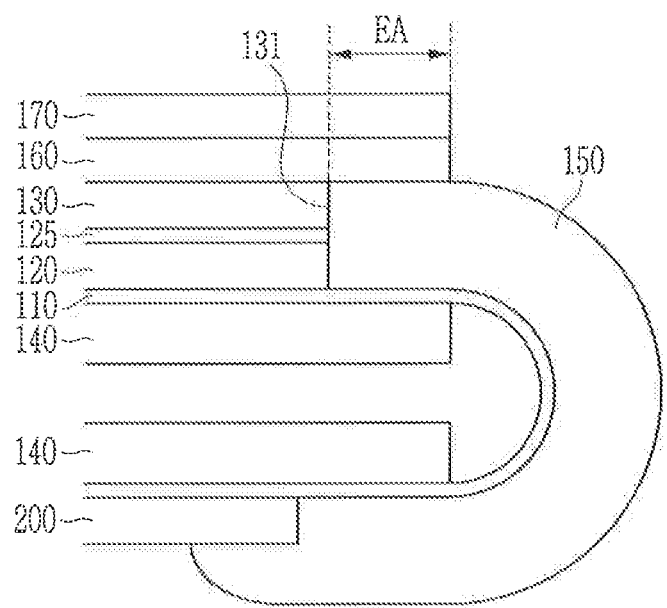
FIG. 3 illustrates a state in which a display device of FIG. 1 is bent.

Referring to FIG. 2 and FIG. 3, according to an embodiment, the display panel 100 includes a substrate 110, a display active layer 120, a first adhesive layer 125, a polarization layer 130, a supporting member 140, a protective layer 150, a second adhesive layer 160, and a laminated member 170.

According to an embodiment, the substrate 110 includes a flexible material such as ultra-thin glass or plastic that can be curved, bent, folded, or rolled. For example, the substrate 110 may include polyimide (PI), polyethylene naphthalate (PEN), polycarbonate (PC), polyarylate (PAR), polyether imide (PEI), polyether sulfone (PES), etc. The substrate 110 is divided into the display area DA and the non-display area PA described above with reference to FIG. 1, and includes the bending area BA of the non-display area PA.

According to an embodiment, the display active layer 120 is disposed on the substrate 110. The display active layer 120 includes a plurality of pixels for displaying an image, wires connected to the plurality of pixels, and a plurality of insulating layers, and is disposed in the display area DA. In some exemplary embodiments, the display active layer 120 includes a touch sensing layer that senses touches.

According to an embodiment, the first adhesive layer 125 is disposed on the display active layer 120. The first adhesive layer 125 includes an optically clear adhesive (OCA).

According to an embodiment, the polarization layer 130 is disposed on the first adhesive layer 125. The polarization layer 130 is adhered to the display active layer 120 by the first adhesive layer 125. The polarization layer 130 reduces reflection of external light. The polarization layer 130 is disposed in the display area DA to correspond to the display active layer 120.

According to an embodiment, the supporting member 140 is disposed under the substrate 110. The supporting member 140 supports and protects the substrate 110. The supporting member 140 includes an opening 145 that overlaps the bending area BA. Accordingly, the display panel 100 can be easily bent in the bending area BA.

According to an embodiment, the protective layer 150 protects the bending area BA and is disposed on the substrate 110. The protective layer 150 is disposed in the non-display area PA includes one end that contacts an end 131 of the polarization layer 130 and another end disposed on the flexible printed circuit film 200, and covers the bending area BA. The flexible printed circuit film 200 is attached to an upper portion of the substrate 110. One end of the protective layer 150 contacts an end of the display active layer 120. The protective layer 150 contains a photocurable organic material. A thickness of the protective layer 150 ranges from about 100 μm to about 150 μm. The thickness of the protective layer 150 is a height of the protective layer 150 in a direction perpendicular to a surface of the substrate 110. An upper surface of the protective layer 150 is substantially coplanar with an upper surface of the polarization layer 130.

As described above, according to an embodiment, the elements and wires that generate or transmit various signals to the display area DA are disposed in the non-display area PA. The elements and wires are disposed on the substrate 110 together with an insulating layer. When the display panel 100 is bent, a wire or insulating layer disposed in the bending area BA can break or crack due to stress and tensile forces due to being bent. In addition, after the display panel 100 is bent, a wire or insulating layer disposed in the bending area BA can be damaged by vibration and external impact. The protective layer 150 can protect against damage that can occur when or after the display panel 100 is bent.

According to an embodiment, the end 131 of the polarization layer 130 corresponds to a boundary between the polarization layer 130 and the protective layer 150. In addition, the protective layer 150 contacts an end of the display active layer 120. In some exemplary embodiments, the end 131 of the polarization layer 130 coincides with the end of the display active layer 120, and in this case, an end of the protective layer 150 coincides with the end of the display active layer 120 and the end of the display active layer 120 corresponds to the boundary between the polarization layer 130 and the protective layer 150.

According to an embodiment, the second adhesive layer 160 is disposed on the polarization layer 130 and the protective layer 150. The second adhesive layer 160 includes an optically clear adhesive (OCA). The second adhesive layer 160 overlaps the polarization layer 130 in the display area DA, and includes an extension area EA that extends from the end 131 of the polarization layer 130 toward the bending area BA in the non-display area PA and overlaps a portion of the protective layer 150. That is, the second adhesive layer 160 is disposed on the boundary between the polarization layer 130 and the protective layer 150. The extension area EA ranges from about 50 μm to about 300 μm in width. That is, the second adhesive layer 160 extends from the end 131 of the polarization layer 130 toward the bending area BA in the non-display area PA by about 50 μm to about 300 μm and overlaps the portion of the protective layer 150. If the second adhesive layer 160 extends from the end 131 of the polarization layer 130 toward the bending area BA by less than 50 μm, that ability of the second adhesive layer 160 to prevent delamination of the protective layer 150 may be weakened. In addition, if the second adhesive layer 160 extends from the end 131 of the polarization layer 130 toward the bending area BA by more than 300 μm, the second adhesive layer 160 may extend past the bending area BA or an edge of the laminated member 170.

According to an embodiment, the laminated member 170 is disposed on the second adhesive layer 160. The laminated member 170 is disposed on the display area DA, and extends toward the bending area BA and overlaps a portion of the non-display area PA. The laminated member 170 includes an extension area EA that extends toward the bending area BA. In this case, the second adhesive layer 160 extends from the end 131 of the polarization layer 130 to an end of the laminated member 170 to overlap a portion of the protective layer 150. In addition, the laminated member 170 is disposed on the boundary between the polarization layer 130 and the protective layer 150, and overlaps the portion of the protective layer 150 in the extension area EA.

In some exemplary embodiments, the laminated member 170 includes elements depending on a function or structure of the display device 1000. For example, if the display active layer 120 does not include a touch sensing layer for sensing touches and the display device 1000 uses a separate touch panel, the laminated member 170 includes a touch panel. That is, a touch panel is disposed on the second adhesive layer 160, and the touch panel is adhered to the polarization layer 130 by the second adhesive layer 160. Alternatively, in some exemplary embodiments, the laminated member 170 includes a cover window that protects the display panel 100. That is, the cover window is disposed on the second adhesive layer 160, and the cover window is adhered to the polarization layer 130 by the second adhesive layer 160.

According to an embodiment, when the display panel 100 is bent, the adherence of the protective layer 150 can be weakened due to stress and tensile forces.

In a present exemplary embodiment, as the second adhesive layer 160 is disposed on the boundary between the polarization layer 130 and the protective layer 150, an adherence of the protective layer 150 can be improved. As the adherence of the protective layer 150 improves, it is possible to bend the display panel 100 and to prevent delamination defects of the protective layer 150 so that the dead space can be further reduced. According to an experimental example, when the second adhesive layer 160 is disposed on the boundary between the polarization layer 130 and the protective layer 150, even though the display panel 100 is bent so that there is 180 μm of dead space, delamination defects of the protective layer 150 do not occur.

Hereinafter, a display active layer 120 according to a present exemplary embodiment will be described.

Figure 4:
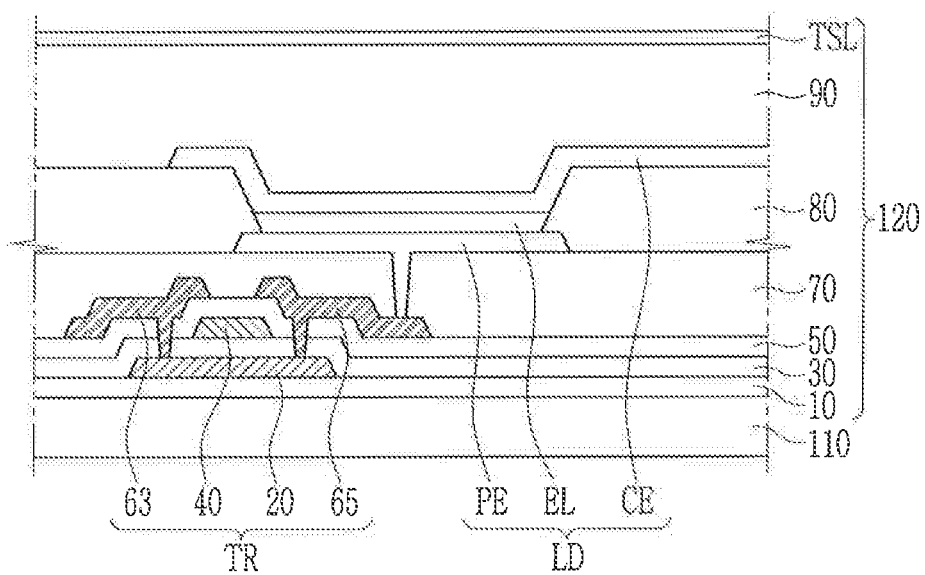
FIG. 4 is a cross-sectional view of a display active layer of a display device according to an exemplary embodiment of the present disclosure.

FIG. 4 is a cross-sectional view of a display active layer of a display device according to an exemplary embodiment of the present disclosure. The cross-section shown in FIG. 4 substantially corresponds to one pixel area.

Referring to FIG. 4, according to an embodiment, the display active layer 120 include a plurality of insulating layers 10, 30, 50, 70, and 80, a transistor TR, a light emitting diode LD connected to the transistor TR, an encapsulation layer 90, and a touch sensor layer TSL.

According to an embodiment, a buffer layer 10 is disposed on the substrate 110. In a process of forming a semiconductor layer 20 of the transistor TR, the buffer layer 10 can block impurities from diffusing from the substrate 110 into the semiconductor layer 20 and can reduce stress on the substrate 110.

According to an embodiment, the semiconductor layer 20 of the transistor TR is disposed on the buffer layer 10, and a gate insulating layer 30 is disposed on the semiconductor layer 20. The semiconductor layer 20 includes a source region, a drain region, and a channel region between the source region and the drain region. The semiconductor layer 20 may include polysilicon, amorphous silicon, or an oxide semiconductor. The gate insulating layer 30 may include an inorganic insulating material such as silicon oxide or silicon nitride.

According to an embodiment, a gate conductor that includes a gate electrode 40 of the transistor TR is disposed on the gate insulating layer 30. The gate conductor may include a metal such as molybdenum (Mo), copper (Cu), aluminum (Al), silver (Ag), chromium (Cr), tantalum (Ta), or titanium (Ti), or a metal alloy thereof.

According to an embodiment, a first insulating layer 50 is disposed on the gate conductor. The first insulating layer 50 includes an inorganic insulating material.

According to an embodiment, a data conductor that includes a source electrode 63 and a drain electrode 65 of the transistor TR is disposed on the first insulating layer 50. The source electrode 63 and the drain electrode 65 are respectively connected to the source region and the drain region of the semiconductor layer 20 through contact holes formed in the first insulating layer 50 and the gate insulating layer 30. The data conductor may include a metal such as aluminum (Al), copper (Cu), silver (Ag), molybdenum (Mo), chromium (Cr), gold (Au), platinum (Pt), palladium (Pd), tantalum (Ta), tungsten (W), titanium (Ti), nickel (Ni), etc., or a metal alloy thereof.

According to an embodiment, a second insulating layer 70 is disposed on the data conductor. The second insulating layer 70 includes an organic insulating material.

According to an embodiment, a pixel electrode PE is disposed on the second insulating layer 70. The pixel electrode PE is connected to the drain electrode 65 through a contact hole formed in the second insulating layer 70 and receives a data signal that controls luminance of the light emitting diode LD.

According to an embodiment, a pixel defining layer 80 is disposed on the second insulating layer 70. The pixel defining layer 80 is provided with an opening that overlaps the pixel electrode PE. An emission layer EL is disposed on the pixel electrode PE, and a common electrode CE is disposed on the emission layer EL. The pixel electrode PE, the emission layer EL, and the common electrode CE form the light emitting diode LD. The pixel electrode PE may be an anode of the light emitting diode LD, and the common electrode CE may be a cathode of the light emitting diode LD.

The encapsulation layer 90 that protects the light emitting diode LD is disposed on the common electrode CE. In some exemplary embodiments, instead of the encapsulation layer 90, an encapsulation substrate is disposed thereon.

According to an embodiment, the touch sensor layer TSL is disposed on the encapsulation layer 90. The touch sensor layer TSL includes touch electrodes formed with a transparent conductive material such as ITO and IZO, a metal mesh, etc., and the touch electrodes may have a single layer or a multiple layers. In some exemplary embodiments, the touch sensor layer TSL is omitted.

Hereinafter, a display device according to another exemplary embodiment will be described with reference to FIG. 5 and FIG. 6. Compared with a display device described above with reference to FIG. 1 to FIG. 3, differences will be mainly described.

Figure 5:
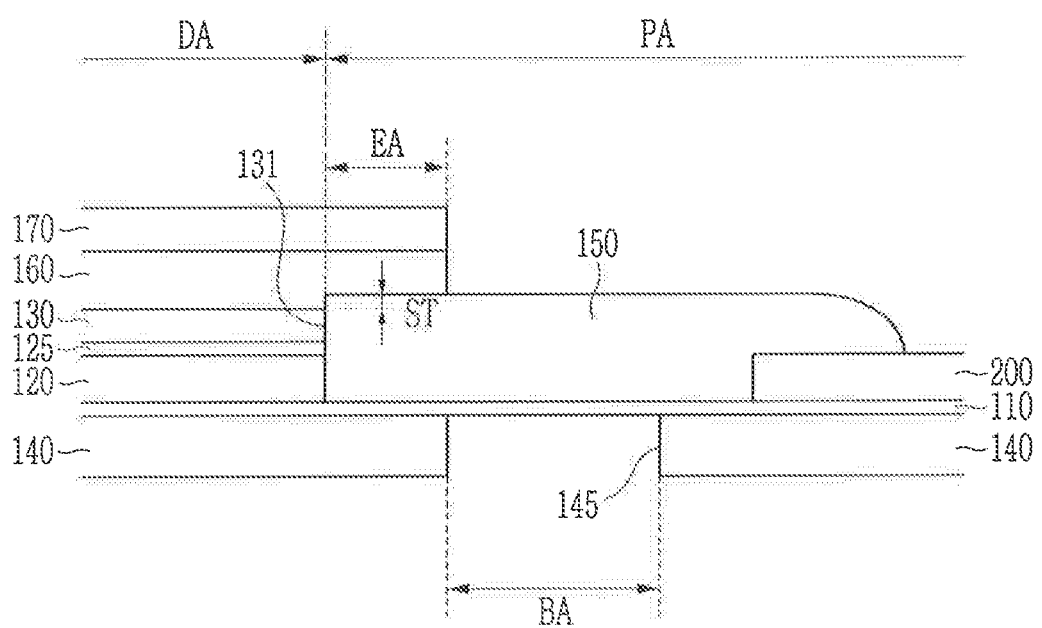
FIG. 5 is a cross-sectional view of a display device according to another exemplary embodiment of the present disclosure.

FIG. 5 is a cross-sectional view of a display device according to another exemplary embodiment of the present disclosure. FIG. 6 illustrates a state in which the display device of FIG. 5 is bent.

Figure 6:
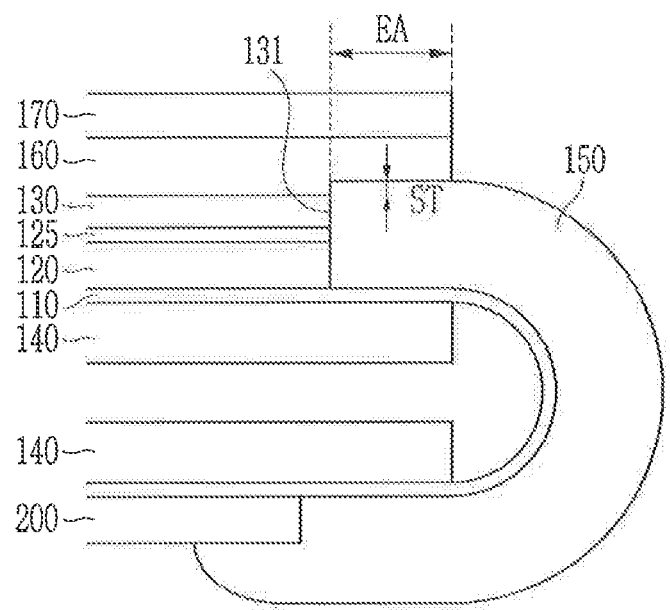
FIG. 6 illustrates a state in which a display device of FIG. 5 is bent.

Referring to FIG. 5 and FIG. 6, according to an embodiment, there is a step ST at the boundary between the polarization layer 130 and the protective layer 150. The polarization layer 130 is formed lower than the protective layer 150 by the step ST. That is, an upper surface of the polarization layer 130 is lower than an upper surface of the protective layer 150 by the step ST.

During a manufacturing process of the display device 1000, when a protective film is disposed, a photocurable organic material for forming the protective layer 150 is coated on the polarization layer 130, the protective film is then removed, and then the second adhesive layer 160 is formed on the polarization layer 130 and the protective layer 150. The step ST corresponds to a thickness of the protective film, and the upper surface of the polarization layer 130 is disposed lower than the upper surface of the protective layer 150 by the step ST. By forming the second adhesive layer 160 on the polarization layer 130 and the protective layer 150 that have the step ST, a contact area between the second adhesive layer 160 and the protective layer 150 can be further increased, and the adherence of the second adhesive layer 160 to the protective layer 150 can be further improved.

Except for these differences, features of an exemplary embodiment described above with reference to FIG. 1 to FIG. 3 can be incorporated into an exemplary embodiment described with reference to FIG. 4 and FIG. 5, so that redundant descriptions are omitted.

Hereinafter, a simulation result of an exemplary embodiment that can prevent delamination defects of the protective layer 150 by disposing the second adhesive layer 160 on the boundary between the polarization layer 130 and the protective layer 150 will be described with reference to FIG. 7 and FIG. 8.

Figure 7:
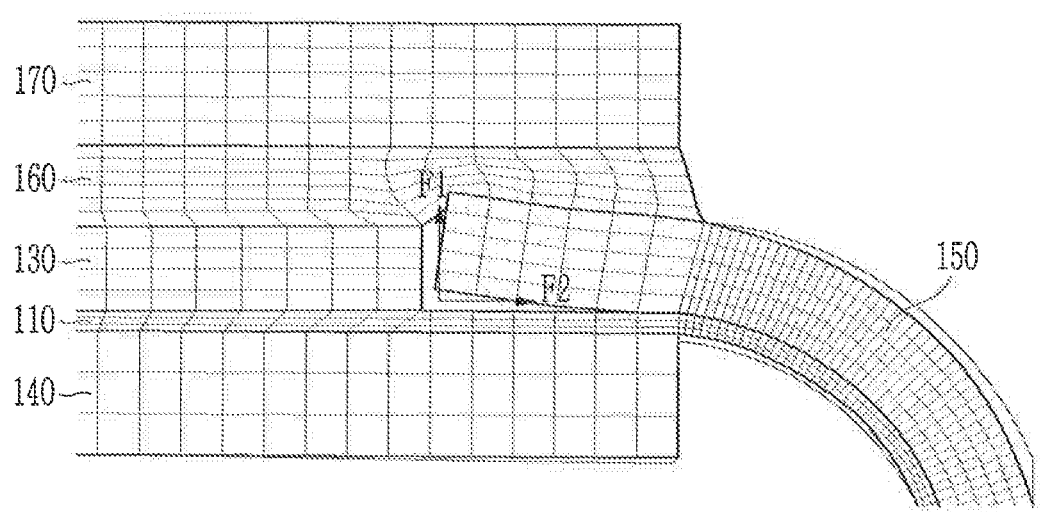
FIG. 7 illustrates a peel-off-force applied to a protective layer when a display panel is bent.
Figure 8:
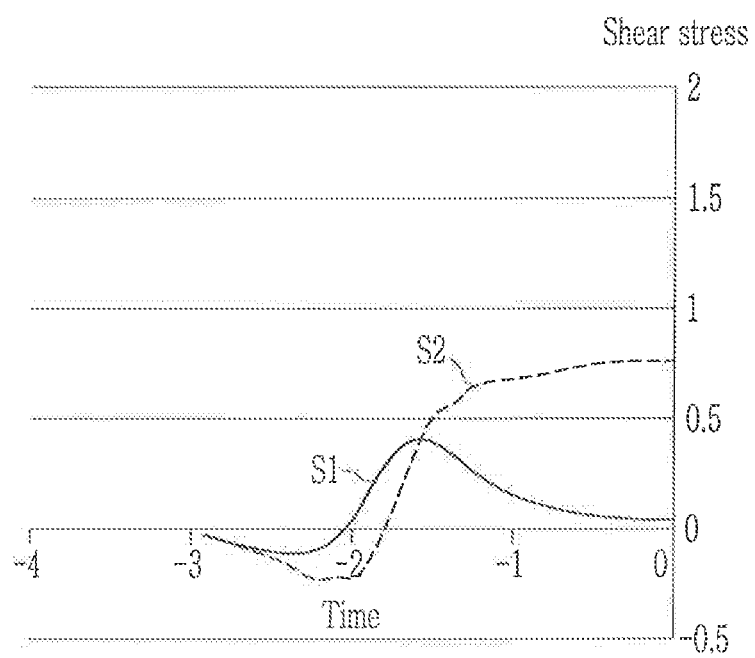
FIG. 8 is a graph of the shearing stress due to the bending of a display panel of FIG. 7.

FIG. 7 illustrates a peel-off-force applied to a protective layer when a display panel is bent, and FIG. 8 is a graph of the shearing stress due to the bending of a display panel of FIG. 7. The display active layer 120 and the first adhesive layer 125 described above with reference to FIG. 2 to FIG. 4 were omitted in the simulation, and the simulation was performed for a case in which the extension area EA is 300 μm in width.

According to an embodiment, when the display panel 100 of FIG. 2 or FIG. 5 is bent as shown in FIG. 3 or FIG. 6, a peel-off-force generated in the protective layer 150 is a sum of a first force F1 in a vertical direction due to the bending of the protective layer 150 and a second force F2 in a horizontal direction due to the shearing stress of the protective layer 150.

As in an exemplary embodiment of the present disclosure, the second adhesive layer 160 extends from the end 131 of the polarization layer 130 toward the bending area BA to overlap a portion of the protective layer 150, thus the first force F1 and the second force F2 can be suppressed by the second adhesive layer 160. That is, the peel-off-force of the protective layer 150 is suppressed, thus the delamination of the protective layer 150 can be prevented.

Referring to FIG. 8, according to an embodiment, when the display panel 100 is bent, and when the second adhesive layer 160 overlaps a portion of the protective layer 150 as in an embodiment of the present disclosure, a magnitude of a first shear stress S1 applied to the protective layer 150 was simulated as a function of time while the display panel 100 is bent, and as a comparative example, when the second adhesive layer 160 does not overlap the protective layer 150, a relative magnitude of a second shear stress S2 applied to the protective layer 150 was simulated as a function of time while the display panel 100 is bent. The maximum of the first shear stress S1 is about 0.4, while the relative maximum of the second shear stress S2 is about 0.8. That is, as compared with a comparative example in which the second adhesive layer 160 does not overlap the protective layer 150, when the second adhesive layer 160 overlaps the protective layer 150 as in an exemplary embodiment of the present disclosure, the shearing stress of the protective layer 150 can be reduced by about 50%.

Hereinafter, a display device according to another exemplary embodiment will be described with reference to FIG. 9 and FIG. 10. Compared with exemplary embodiments of FIG. 1 to FIG. 3 described above, differences will be mainly described.

Figure 9:
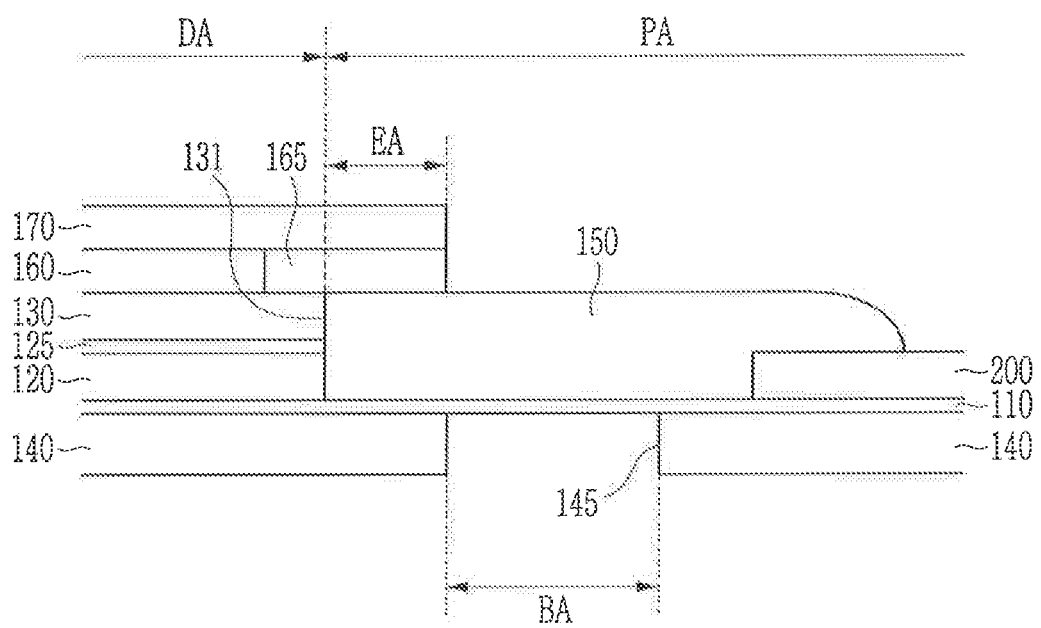
FIG. 9 is a cross-sectional view of a display device according to another exemplary embodiment of the present disclosure.

FIG. 9 is a cross-sectional view of a display device according to another exemplary embodiment of the present disclosure. FIG. 10 illustrates a state in which a display device of FIG. 9 is bent.

Figure 10:
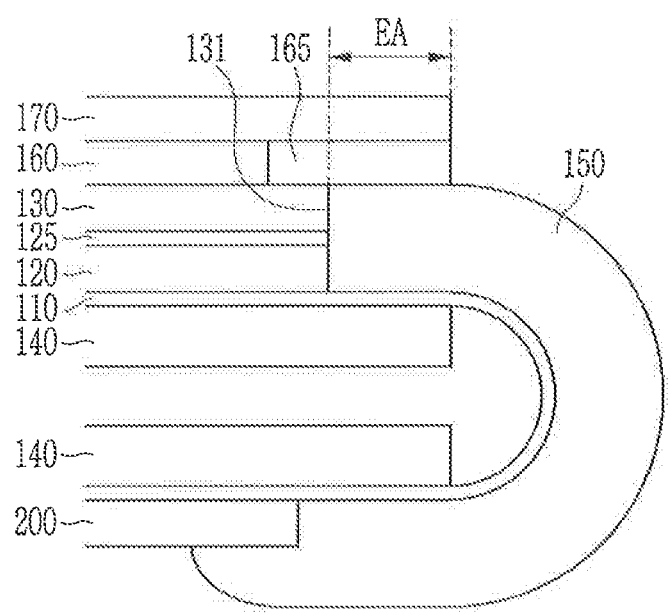
FIG. 10 illustrates a state in which a display device of FIG. 9 is bent.

Referring to FIG. 9 and FIG. 10, according to an embodiment, the display panel 100 includes the substrate 110, the display active layer 120, the first adhesive layer 125, the polarization layer 130, the supporting member 140, the protective layer 150, the second adhesive layer 160, a filling layer 165, and the laminated member 170. That is, compared with an exemplary embodiment of FIG. 1 to FIG. 3 described above, the display panel 100 additionally includes the filling layer 165.

According to an embodiment, the second adhesive layer 160 is disposed between the polarization layer 130 and the laminated member 170 and overlaps the polarization layer 130, however it does not extend to the end 131 of the polarization layer 130 but does not overlap the polarization layer 130 in the vicinity of the end 131 of the polarization layer 130.

According to an embodiment, the filling layer 165 is disposed on the boundary between the polarization layer 130 and the protective layer 150. The filling layer 165 contacts an end of the second adhesive layer 160 in the display area DA and overlaps a portion of the polarization layer 130, and includes the extension portion EA that extends toward the bending area BA and overlaps a portion of the protective layer 150. The filling layer 165 extends from the end 131 of the polarization layer 130 toward the bending area BA by from about 50 μm to about 300 μm and overlaps the portion of the protective layer 150.

According to an embodiment, the laminated member 170 is disposed on the second adhesive layer 160 and the filling layer 165. The laminated member 170 includes the extension area EA that extends toward the bending area BA, and in this case, the filling layer 165 extends from the end 131 of the polarization layer 130 to the end of the laminated member 170 in the non-display area PA and overlaps a portion of the protective layer 150.

According to an embodiment, after the display panel 100 is bent, a gap between the polarization layer 130 and the laminated member 170 and a gap between the protective layer 150 and the laminated member 170 is filled with the filling layer 165. The filling layer 165 includes a filler of an organic or inorganic material.

In a present exemplary embodiment, the filling layer 165 is disposed on the boundary between the polarization layer 130 and the protective layer 150. Accordingly, the adherence of the protective layer 150 is improved. As the adherence of the protective layer 150 improves, it is possible to bend the display panel 100 and to prevent delamination defects of the protective layer 150 so that dead space can be further reduced.

Except for these differences, the features of exemplary embodiments described above with reference to FIG. 1 to FIG. 3 can be incorporated into an exemplary embodiment described with reference to FIG. 4 and FIG. 10, so that redundant descriptions are omitted.

Hereinafter, a display device according to another exemplary embodiment will be described with reference to FIG. 11 and FIG. 12. Compared with a display device described above with reference to FIG. 1 to FIG. 3, differences will be mainly described.

Figure 11:
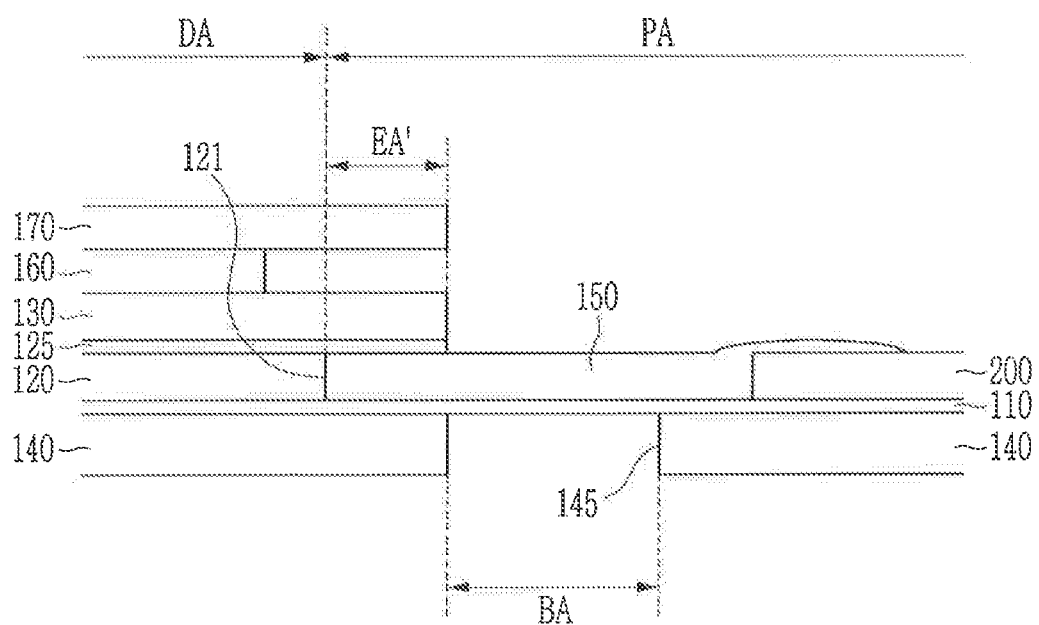
FIG. 11 is a cross-sectional view of a display device according to another exemplary embodiment of the present disclosure.

FIG. 11 is a cross-sectional view of a display device according to another exemplary embodiment of the present disclosure. FIG. 12 illustrates a state in which a display device of FIG. 11 is bent.

Figure 12:
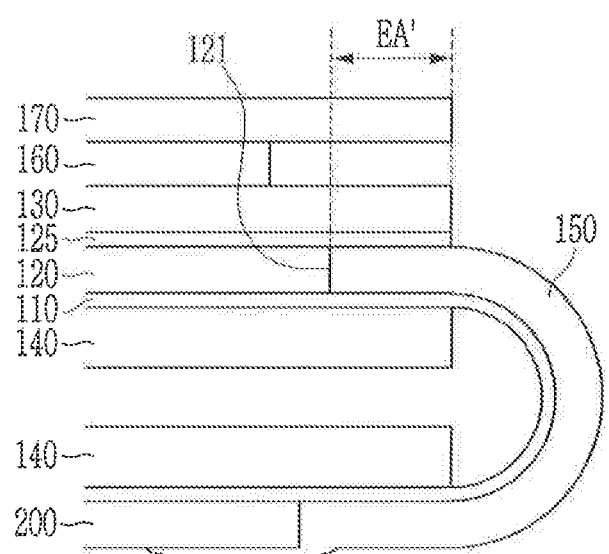
FIG. 12 illustrates a state in which a display device of FIG. 11 is bent.

Referring to FIG. 11 and FIG. 12, according to an embodiment, the protective layer 150 includes one end that contacts an end 121 of the display active layer 120, another end disposed on the flexible printed circuit film 200, and covers the bending area BA. The end 121 of the display active layer 120 corresponds to a boundary between the display active layer 120 and the protective layer 150.

According to an embodiment, the first adhesive layer 125 and the polarization layer 130 are disposed on the boundary between the display active layer 120 and the protective layer 150. The first adhesive layer 125 and the polarization layer 130 overlap the display active layer 120 in the display area DA, and include an extension area EA' in the non-display area PA that extends from the end 121 of the display active layer 120 toward the bending area BA to overlap the portion of the protective layer 150.

According to an embodiment, the second adhesive layer 160 is disposed between the polarization layer 130 and the laminated member 170 and overlaps the polarization layer 130, however it does not include the extension area EA' and does not overlap the polarization layer 130 in the vicinity of the end of the polarization layer 130. Alternatively, in some exemplary embodiments, as illustrated in FIG. 2 and FIG. 3, the second adhesive layer 160 may extend to the end of the laminated member 170 to overlap a portion of the protective layer 150. The laminated member 170 overlaps the boundary between the display active layer 120 and the protective layer 150.

In a present exemplary embodiment, the first adhesive layer 125 and the polarization layer 130 are disposed on the boundary between the display active layer 120 and the protective layer 150. Accordingly, the adherence of the protective layer 150 is improved. As the adherence of the protective layer 150 improves, it is possible to bend the display panel 100 and to prevent delamination defects of the protective layer 150 so that dead space can be further reduced.

Except for these differences, features of exemplary embodiments described above with reference to FIG. 1 to FIG. 3 can be incorporated into an exemplary embodiment described with reference to FIG. 11 and FIG. 12, so that redundant descriptions are omitted.

While embodiments of this disclosure have been described in connection with what is presently considered to be practical exemplary embodiments, it is to be understood that embodiments of the disclosure are not limited to the disclosed exemplary embodiments, but, on the contrary, are intended to cover various modifications and equivalent arrangements included within the spirit and scope of the appended claims,

What is claimed is:

1. A display device comprising:
a substrate that includes a bending area;
a display active layer disposed on the substrate and that displays an image;
a polarization layer disposed on the display active layer;
a protective layer that contacts an end of the polarization layer and covers the bending area of the substrate; and
an adhesive layer disposed on a boundary between the polarization layer and the protective layer, the adhesive layer extends from the end of the polarization layer toward the bending area by an extension area to overlap a portion of the protective layer.

2. The display device of claim 1, wherein the extension area ranges from 50 µm to 300 µm in width.

3. The display device of claim 1, wherein the substrate includes
a display area on which the display active layer is disposed and
a non-display area that includes the bending area.

4. The display device of claim 3, wherein
the adhesive layer overlaps the polarization layer in the display area, and overlaps the portion of the protective layer in the non-display area, and
the protective layer contacts an end of the display active layer.

5. The display device of claim 1, wherein an upper surface of the protective layer is coplanar with an upper surface of the polarization layer.

6. The display device of claim 1, wherein an upper surface of the protective layer is higher than an upper surface of the polarization layer.

7. The display device of claim 1, further comprising
a laminated member disposed on the adhesive layer,
wherein the laminated member is disposed on the boundary between the polarization layer and the protective layer.

8. The display device of claim 7, wherein the laminated member is a touch panel.

9. A display device comprising:
a substrate that includes a bending area;
a display active layer disposed on the substrate and that displays an image;
a polarization layer disposed on the display active layer;
a protective layer that contacts an end of the polarization layer and covers the bending area of the substrate;
an adhesive layer disposed on the polarization layer; and
a filling layer disposed on a boundary between the polarization layer and the protective layer that contacts an end of the adhesive layer, and includes an extension area that extends from the end of the polarization layer toward the bending area and overlaps a portion of the protective layer.

10. The display device of claim 9, wherein the extension area ranges from 50 µm to 300 µm in width.

11. The display device of claim 9, wherein the substrate includes
a display area on which the display active layer is disposed and
a non-display area that includes the bending area.

12. The display device of claim 11, wherein
the filling layer overlaps some of the polarization layer in the display area, and overlaps the portion of the protective layer in the non-display area, and
the protective layer contacts an end of the display active layer.

13. The display device of claim 9, further comprising
a laminated member disposed on the adhesive layer and the filling layer,
wherein the laminated member is disposed on the boundary between the polarization layer and the protective layer.

14. A display device comprising:
a substrate that includes a bending area;
a display active layer disposed on the substrate and that displays an image;
a protective layer that contacts an end side surface of the display active layer and covers the bending area of the substrate;
a polarization layer disposed on a boundary between the display active layer and the protective layer and that includes an extension area that extends from the end of the display active layer toward the bending area and overlaps a portion of an upper surface of the protective layer in the extension area; and
a first adhesive layer disposed between the display active layer and the polarization layer,
wherein the first adhesive layer overlaps the display active layer in the display area, and extends from the end of the display active layer toward the bending area and overlaps the portion of the protective layer in the non-display area.

15. The display device of claim 14, wherein the extension area ranges from 50 µm to 300 µm in width.

16. The display device of claim 14, wherein the substrate includes a display area on which the display active layer is disposed and a non-display area that includes the bending area.

17. The display device of claim 16, wherein the polarization layer overlaps the display active layer in the display area, and overlaps the portion of the protective layer in the non-display area.

18. The display device of claim 1, further comprising:
a second adhesive layer disposed on the polarization layer; and
a laminated member disposed on the second adhesive layer,
wherein the laminated member overlaps a boundary between the polarization layer and the protective layer.

19. The display device of claim 18, wherein the second adhesive layer overlaps the polarization layer in the display area, and does not extend into the non-display area.

* * * * *